United States Patent
McCarthy

(12) 
(10) Patent No.: US 6,717,475 B2
(45) Date of Patent: Apr. 6, 2004

(54) FAST-ACQUISITION PHASE-LOCKED LOOP

(75) Inventor: Evan S. McCarthy, Costa Mesa, CA (US)

(73) Assignee: Skyworks Solutions, Inc., Newport Beach, CA (US)

( * ) Notice: Subject to any disclaimer, the term of this patent is extended or adjusted under 35 U.S.C. 154(b) by 171 days.

(21) Appl. No.: 10/032,848

(22) Filed: Nov. 1, 2001

(65) Prior Publication Data

US 2003/0080818 A1 May 1, 2003

(51) Int. Cl.[7] ................................................ H03L 7/00
(52) U.S. Cl. ............................ 331/17; 331/25; 327/147
(58) Field of Search ........................... 331/17, 25, 1 A; 327/147, 148, 150, 156, 157, 159

(56) References Cited

U.S. PATENT DOCUMENTS 5,920,233 A * 7/1999 Denny ......................... 331/14
6,157,271 A * 12/2000 Black et al. ................. 332/127
6,466,096 B1 * 10/2002 DeVito ......................... 331/11

* cited by examiner

Primary Examiner—Henry Choe
(74) Attorney, Agent, or Firm—Mintz, Levin, Cohn, Ferris, Glovsky & Popeo P.C.

(57) ABSTRACT

The invention provides techniques for compensating for current leakage from a loop filter during off times of a PLL between on times of the PLL, e.g., when a cell phone is in paging mode. The leakage current is compensated by providing offsetting charge to ensure that the VCO tuning voltage when the PLL is turned from "off" to "on" is at or near the VCO tuning voltage when the PLL is locked (the VCO-lock voltage). Several techniques can be used compensate for the leakage current and several techniques can be used to determine how accurately the leakage current is being compensated for, and what, if any, adjustments to make in the offsetting charge to adequately compensate for the leakage current.

34 Claims, 7 Drawing Sheets

FAST-ACQUISITION PHASE-LOCKED LOOP

BACKGROUND OF THE INVENTION

1. Technical Field

The invention relates to phase-locked loops (PLL's) and more particularly to compensating for variances in tuning voltage of a voltage-controlled oscillator (VCO) of a PLL during deactivated times of the PLL.

2. Background of the Invention

Portable telephones, such as cellular telephones, are very popular and becoming more popular and widespread every day. People enjoy the convenience of having a phone at their disposal no matter where they are. Impinging upon this convenience is the need to recharge the battery of the telephone periodically. If this time between recharges can be made longer, then the telephone becomes more convenient and useful.

To reduce battery power consumption, portable telephones sometimes are made to have an operating state called a paging mode. In this mode, the phone periodically turns on the phone's receiver to check whether there is an incoming call. The phone is only on (activated) for a short period of time, and off (deactivated) for times between the on times, thus saving total average current and improving standby time (i.e., time when the phone is not in use).

SUMMARY

A number of technical advances are achieved in the art by implementation of a fast-acquisition PLL for reducing PLL lock time. The fast-acquisition PLL may be broadly conceptualized as a system that compensates for VCO leakage current; thus reducing or eliminating frequency acquisition time.

For example, a fast-acquisition PLL that periodically activates and deactivates may utilize a system architecture that recognizes that VCO tuning voltage when the PLL is activated and the when PLL is locked (the VCO-lock voltage) is related to the lost charge while the PLL is deactivated. An implementation of the system architecture may include a charge pump, a loop filter connected to the charge pump, a VCO connected to the loop filter, a controller connected to the VCO, and a current source connected to the controller and the loop filter. The controller monitors a VCO tuning voltage at a VCO input and determines the amount of voltage lost during a deactivated time of the PLL, e.g., according to a difference between the VCO-lock voltage and the tuning voltage when the PLL is activated. The controller provides a signal to the current source indicating the lost voltage. In response to the signal from the controller, the current source provides current to the loop filter to compensate for leakage current to help maintain the tuning voltage of the VCO at the VCO-lock voltage, or at least help ensure that the tuning voltage is approximately at the VCO-lock voltage when the PLL is activated. The current source may be several current sub-sources, such as current mirrors, that provide amounts of current that are related to each other, e.g., by a binary progression. The current sub-sources can be selected to provide appropriate amounts of current based on the signal from the controller. The current may be provided continuously throughout the deactivated time or may be provided during a portion of the deactivated time that is less than the entire deactivated time.

Another implementation of the fast-acquisition PLL may also utilize a system architecture that includes a charge pump, a loop filter connected to the charge pump, a VCO connected to the loop filter, and a controller connected to the VCO. In this implementation, the charge pump is responsive to the signal from the controller to turn on for at least a portion of the deactivated time of the PLL to provide sufficient charge to the VCO such that the tuning voltage when the PLL is activated is approximately at the VCO-lock voltage. The charge may be provided in one or more pulses and may be at an initial portion of the deactivated time of the PLL, or later.

In either implementation, the controller can determine the lost charge from the VCO using techniques other than monitoring the VCO tuning voltage. For example, the controller can integrate charge provided to the loop filter by the charge pump during active time periods of the PLL. Alternatively, the controller can integrate an error signal provided by a phase detector of the PLL to the charge pump during active time periods of the PLL, e.g., from the time the PLL is activated until the PLL locks.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principals of the invention. Moreover, in the figures, like reference numerals designate corresponding parts throughout the different views.

Reference will now be made in detail to the description of the invention as illustrated in the figures. While the invention will be described in connection with these figures, there is no intent to limit it to the embodiment or embodiments disclosed in these figures. On the contrary, the intent is to cover all alternatives, modifications, and equivalents included within the spirit and scope of the invention as defined by the appended claims.

DETAILED DESCRIPTION OF PREFERRED EMBODIMENTS

Figure 1:
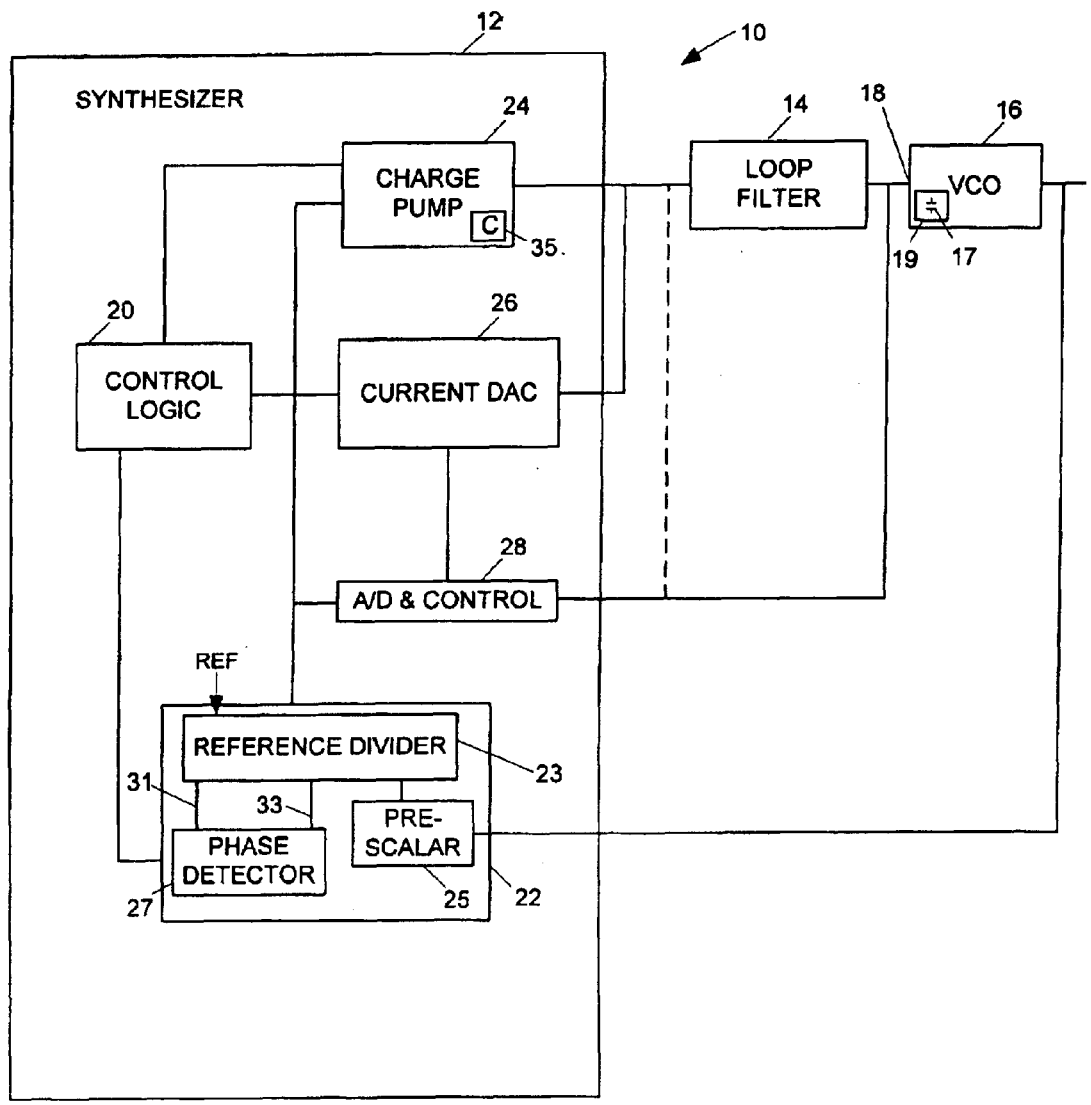
FIG. 1 is a block diagram of a phase-locked loop system according to the invention.

Referring to FIG. 1, a phase-locked loop (PLL) 10 includes a synthesizer 12, a loop filter 14, and a voltage-controlled oscillator (VCO) 16. The PLL 10 is configured to lock onto a reference frequency provided to the synthesizer 12 and output a signal of the same frequency from the VCO 16. This output signal is provided by the VCO 16 in response to a tuning voltage provided at a tuning pin or tuning line 18 of the VCO 16. The voltage provided to the tuning pin 18 is provided from the loop filter 14. The loop filter 14 is a low-pass filter (LPF) that can be capacitive in nature. During deactivated times of the PLL 10, leakage current may flow from the synthesizer 12 (in particular, a charge pump 24 of the synthesizer 12), the loop filter 14, and/or the VCO 16. Leakage current may flow into the loop filter 14 from the charge pump 24 or from the charge pump 24 into the loop filter 14. Leakage current from the loop filter 14 causes the tuning voltage at the tuning pin 18 to decrease during deactivated times of the PLL 10 and leakage current into the loop filter 14 acts to increase the tuning voltage at the tuning pin 18. The synthesizer 12 is configured to, during active times of the PLL 10, adjust the tuning voltage of the VCO 16 depending on a phase difference between the frequency of the VCO's output divided by N (of an N-counter described below) and the frequency of a reference signal. The synthesizer 12 is configured to adjust the tuning voltage until the output signal from the VCO 16 has approximately the same frequency as the frequency of the reference signal. At this point, the PLL 10 is considered to be locked to the reference frequency, with the tuning voltage at the tuning pin 18 being at a VCO-lock voltage. The VCO-lock voltage may be a range of voltages over which a frequency difference between the VCO output voltage signal and the reference signal REF is within an acceptable tolerance. This tolerance may be, for example, 100 Hz and the VCO sensitivity may be, for example, 45 MHz/volt.

To adjust the tuning voltage during active times of the PLL 10, the synthesizer 12 includes control logic 20, a circuit 22, and a charge pump 24. The circuit 22 includes a reference divider 23, a pre-scalar 25, and a phase detector 27. The control logic 20 is configured to provide control signals to the charge pump 24 to regulate the amount and polarity of charge provided by the charge pump 24. The charge pump 24 is configured to receive control signals from the control logic 20 and an error signal from the phase detector 27, and in response to these signals, to provide charge to the loop filter 14. The amount of time and polarity of the charge are determined by the control signals and the error signal. The charge from the charge pump 24, in filtered form, will be received by the VCO 16 and will affect the VCO tuning voltage, and therefore the output frequency of the output signal of the VCO 16. The pre-scalar 25 is configured to receive a portion of the VCO output signal, scale the received signal portion, and pass a scaled signal to an N-counter of the reference divider 23. The N-counter can divide the frequency of the scaled signal by N and provide the result 31 ($f_{scal}/N$) to the phase detector 27. An R-counter of the reference divider 23 can receive a reference signal REF, divide the REF signal by R and provide the divided signal 33 (REF/R) to the phase detector 27. The phase detector 27 is configured to compare the signals from the R-divider and the N-divider and provide an error signal to the charge pump 24 indicative of the difference in frequencies of the R-divided and N-divided signals.

The synthesizer 12 further includes a current digital-to-analog converter (DAC) 26 and an analog-to-digital converter (A/D) and control 28. These components 26 and 28 are configured to adjust the VCO tuning voltage while the PLL 10 is deactivated in response to, among other things, control signals from the control logic 20. In particular, the A/D and control 28 is coupled to the tuning pin 18 and is configured to, in response to signals from the control logic 20, monitor the tuning voltage. The monitored voltage includes the tuning voltage when the PLL 10 is initially activated (i.e., at the activation time $t_{ac}$) and when the PLL 10 is locked (i.e., the VCO-lock voltage). The A/D and control 28 is configured to, in response to signals from the control logic 20, determine the difference between the VCO tuning voltage at the activation time $t_{ac}$ and the VCO-lock voltage. In response to this determination, the A/D and control 28 may output an indication of this difference to the current DAC 26. In response to receiving the output from the A/D and control 28, and receiving control signals from the control logic 20, the current DAC 26 may supply a compensation current to the loop filter 14. To supply the compensation current, the DAC 26 may be an adjustable current source that is responsive to the output from the A/D and control 28, or may be multiple selectable current sources configured to be selected in response to the output from A/D and control 28.

Figure 2:
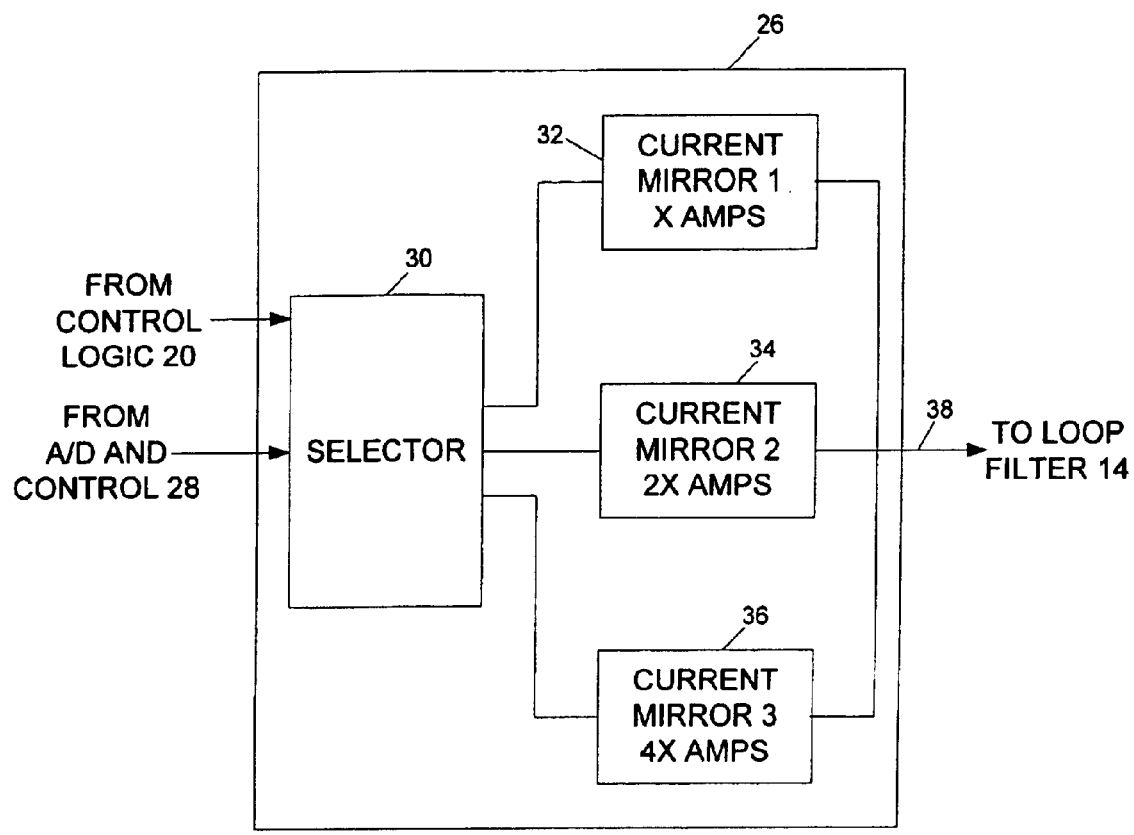
FIG. 2 is a block diagram of a current digital-to-analog converter shown in FIG. 1.

Referring to the embodiment of FIG. 2, the illustrated DAC 26 includes, here, a selector 30, and three current mirrors 32, 34, and 36, although other quantities of current mirrors may be employed. The selector 30 is coupled to the A/D and control 28 and configured to receive the output of the A/D and control 28. The selector 30 is coupled to the control logic 20 (FIG. 1) and is configured to send and receive signals to and from the control logic 20. For example, the selector 30 can send indications of the output received from the A/D and control 28 to the control logic 20 and receive control signals from the control logic 20 indicative of which one or ones of the current mirrors 32, 34, and 36 to select.

In response to input received by the selector 30, the selector 30 may select one or more of the current mirrors 32, 34, and 36 to provide any desired amounts of current. In the illustrated embodiment, the one or more selected current mirrors 32, 34, and 36 each provide fixed amounts of current onto a common output line 38, with currents from the mirrors, 32, 34, and 36 adding to form a single current on the output line 38. The fixed amounts of the currents from the mirrors 32, 34, and 36 are preferably of differing amounts, here being a binary progression of current amplitudes with the current mirror 32 providing X amps of current, the current mirror 34 providing two times the number amps of the current mirror 32 (i.e., 2×amps), and the current mirror 36 providing four times the amount of amps of the current mirror 32 (i.e., 4×amps). The output line 38 is coupled to the loop filter 14 to provide the current from the current sources 32, 34, and 36 to the loop filter 14 to compensate for leakage current from the loop filter 14 during deactivated times of the PLL 10 (FIG. 1).

The maximum and minimum current amounts providable by the current DAC 26 are determined to help ensure rapid locking of the PLL 10. The maximum amount of current providable by the current mirrors 32, 34, and 36, here 7×amps, corresponds to the expected maximum possible leakage current that might affect the tuning voltage. The smallest increment of current, here X amps, is selected to be less than an amount of current that would swing the VCO output signal from one extreme of the PLL's desired frequency tolerance to the other extreme. In other words, the smallest increment of current provided by the current DAC 26 is such that the total current will be able to adjust the VCO output signal to within the PLL's frequency tolerance.

Figure 12:
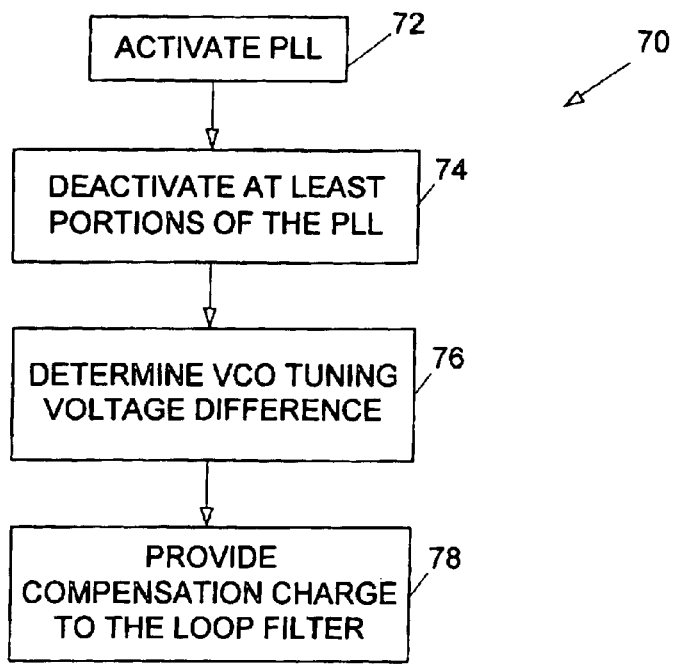
FIG. 12 is a flowchart of a process of locking to a frequency using the system shown in FIG. 1.
Figure 13:
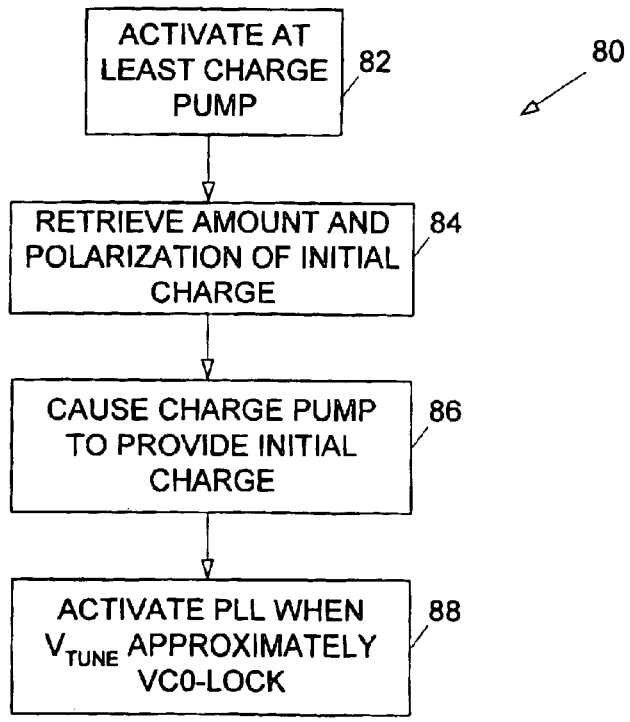
FIG. 13 is a flowchart of initially compensating tuning voltage of the voltage-controlled oscillator shown in FIG. 1.

In operation, referring to FIGS. 1 and 12, a process 70 of locking to a frequency with reduced acquisition times begins at stage 72 with the activation of the PLL 10. Components of the PLL 10 are activated so that the PLL 10 may attempt to lock to a frequency of an incoming signal. The PLL 10 locks onto a reference frequency by adjusting the VCO tuning voltage until a frequency difference between the VCO output signal and the reference signal REF is within a selected frequency-difference tolerance, e.g. 100 Hz. The tolerance is the range in which the VCO is considered locked and can depend on the type of system in which the VCO resides.

To adjust the VCO tuning voltage, with the PLL 10 activated, at a time $t_{ac}$, the circuit 22 determines the phase difference between the reference signal REF and the VCO output signal and provides an error signal indicating this difference to the charge pump 24. This difference is proportional to the amount of time that the charge pump 24 is activated and to the polarity of the charge provided during this time by the charge pump 24 to the loop filter 14. The loop filter 14 filters the charge from the charge pump 24 and provides the filtered charge to the tuning pin 18 of the VCO 16. In response to the received charge, the VCO tuning voltage moves up or down, depending on the polarity and amount of the charge provided, and correspondingly provides a different frequency output, with the frequency increasing or decreasing depending on whether the VCO tuning voltage increased or decreased.

The tuning voltage is adjusted until the phase difference detected by the circuit 22 is within a selected tolerance such that the frequency difference between the VCO output signal and the reference signal REF is within the selected frequency-difference tolerance. When the frequency difference is within the selected tolerance, the PLL 10 is considered to be locked, with the VCO tuning voltage being within a VCO-lock voltage tolerance range. The VCO 16 can continue to refine its output frequency within the frequency tolerance, with the VCO tuning voltage approaching and possibly equaling a VCO-lock voltage at or near the center of the VCO-lock voltage tolerance range. The time from the activation time $t_{ac}$, to the time when the PLL 10 is locked is referred to as the acquisition time $t_{acquisition}$ (FIG. 4) of the PLL 10. The PLL 10 is deactivated some time later at a deactivation time $t_{deac}$.

At stage 74, at least some of the components of the PLL 10 used for locking to a frequency, are deactivated at the deactivation time $t_{deac}$. While these PLL components are deactivated, absent compensating charge being provided to the VCO 16, the VCO tuning voltage will drop, e.g., due to leakage current of the charge pump 24, loop filter 14, and/or the VCO 16. If the VCO tuning voltage drops by an amount such that the output frequency of the VCO 16 differs from the reference signal frequency by an amount exceeding the tolerance of the PLL 10 before the next activation time $t_{ac}$, then the PLL 10 will experience some acquisition time to adjust the VCO tuning voltage such that VCO output signal and the reference signal REF are within the desired tolerance of each other. For example, if the PLL 10 is used as part of a cellular phone, and the cellular phone is in a paging mode in which the cellular phone periodically turns on and off (e.g., in an attempt to conserve battery time during stand-by) the PLL may experience repeated acquisition times.

If the VCO tuning voltage can be made to be near or at the VCO-lock voltage at the activation time $t_{ac}$, then the acquisition time can be reduced or eliminated. The savings in time and energy for acquisition or re-acquisition of the proper VCO output signal more than compensates for the added energy to put the VCO tuning voltage at or near the VCO-lock voltage at the activation time $t_{ac}$. During repeated activated and deactivated times of the PLL 10, the A/D and control 28 monitors the VCO tuning voltage and determines compensation current to be supplied to the loop filter 14 during deactivated times of the PLL 10. This may be an interactive process with the compensation determined by putting the VCO tuning voltage closer to the VCO-lock voltage (or some other voltage) each iteration until a limit and/or an acceptable proximity is reached.

Figure 4:
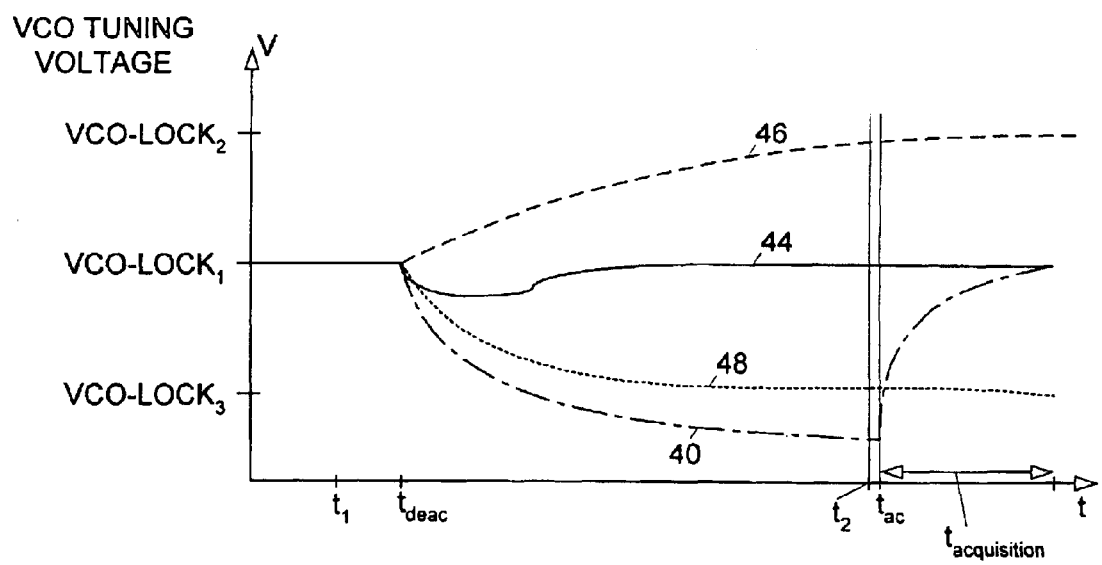
FIG. 4 is a graph of tuning voltage of a voltage-controlled oscillator shown in FIG. 1 in response to the outputs shown in FIG. 3.

Referring also to FIG. 4, at stage 76 (FIG. 12) the A/D and control 28 determines the difference between the tuning voltage at or near the activation time $t_{ac}$ and the VCO-lock voltage. To do this, the A/D and control 28 monitors the VCO tuning voltage at a time when the VCO tuning voltage is at a voltage VCO-lock$_1$, e.g., a time $t_1$, and at a time at or near the activation time $t_{ac}$ of the PLL 10, e.g., $t_2$. Alternatively, if the relationship between the voltage at or near time $t_{ac}$ and the voltage at another time between $t_{deac}$ and $t_{ac}$ is known, the voltage at this other time can be monitored. At the time $t_1$, the A/D and control 28 determines the VCO-lock voltage VCO-lock$_1$, and, as indicated by plot 40 in FIG. 4, at time $t_2$, the A/D control 28 determines the VCO tuning voltage in the absence of any compensating current supplied to the loop filter 14. By comparing these two voltages, the A/D and control 28 determines the amount of compensation current to be supplied to the loop filter 14 such that the VCO tuning voltage is at or near the VCO lock voltage VCO-lock$_1$ at the activation time $t_{ac}$.

Figure 3:
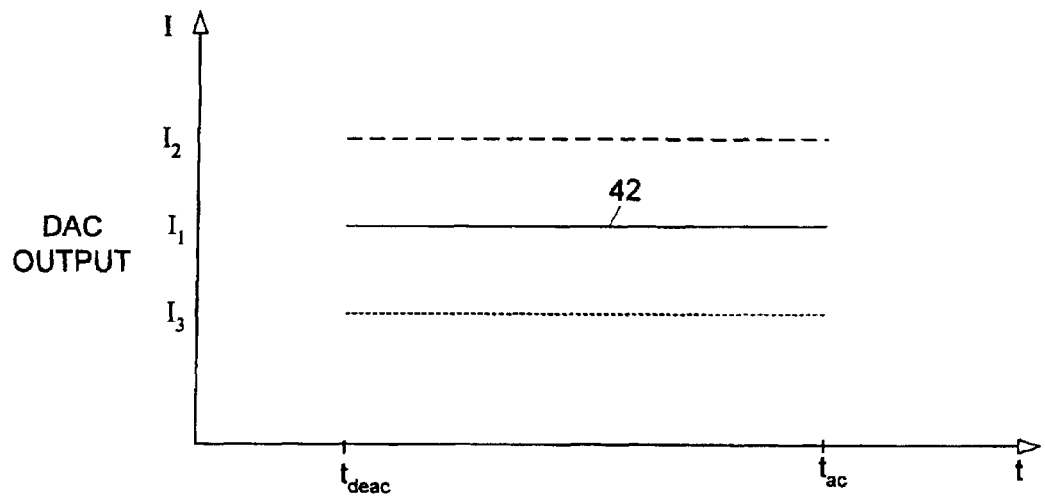
FIG. 3 is a graph of outputs of the converter shown in FIG. 2.

Referring also to FIG. 3, at stage 78 (FIG. 12) the A/D and control 28 controls the current DAC 26 to provide compensation charge in the form of a current at the DAC output to the loop filter 14 to help ensure that the VCO tuning voltage at the activation time $t_{ac}$ is at or near a desired VCO-lock voltage. For example, the A/D and control 28 may determine that the compensation current should be equal to $I_1$ to have the VCO tuning voltage at or near the VCO-lock voltage VCO-lock$_1$ at the acquisition time $t_{ac}$. In response to this determination, the A/D and control 28 controls the current DAC 26 to output the compensation current $I_1$ continuously from the deactivation time $t_{deac}$ to the activation time $t_{ac}$ as shown by plot 42 in FIG. 3. Correspondingly, as shown by plot 44 in FIG. 4, the VCO tuning voltage initially declines after the deactivation time $t_{deac}$ and eventually returns to the previous VCO lock voltage VCO-lock$_1$ in time for the next activation time $t_{ac}$.

The A/D and control 28 can also determine compensation currents if the desired VCO tuning voltage for the next activation $t_{ac}$ is different than the VCO tuning voltage from the previous active time of the PLL 10. For example, the A/D and control 28 can control the current DAC 26 to output a compensation current $I_2$, that is greater than $I_1$, during the deactivated time of the PLL 10 to affect the VCO tuning voltage as indicated by plot 46 in FIG. 4. With a compensation current of $I_2$, the VCO tuning voltage approximately equals a VCO-lock$_2$ voltage at the next activation time $t_{ac}$.

Also, the A/D and control 28 can control the current DAC 26 to provide a compensation current $I_3$, that is less than $I_1$ (and possibly opposite in polarity), during the deactivated time of the PLL 10 to adjust the VCO tuning voltage as shown in plot 48 of FIG. 4. The current $I_3$ causes the VCO tuning voltage to approximately equal a voltage VCO-lock$_3$ at the activation time $t_{ac}$.

Figure 5:
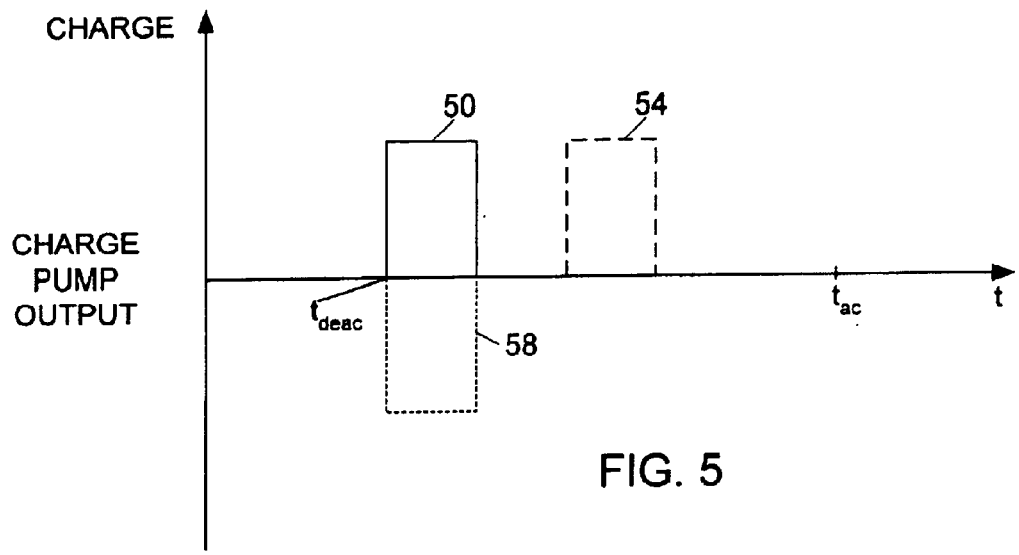
FIG. 5 is a graph of an output of a charge pump shown in FIG. 1.
Figure 6:
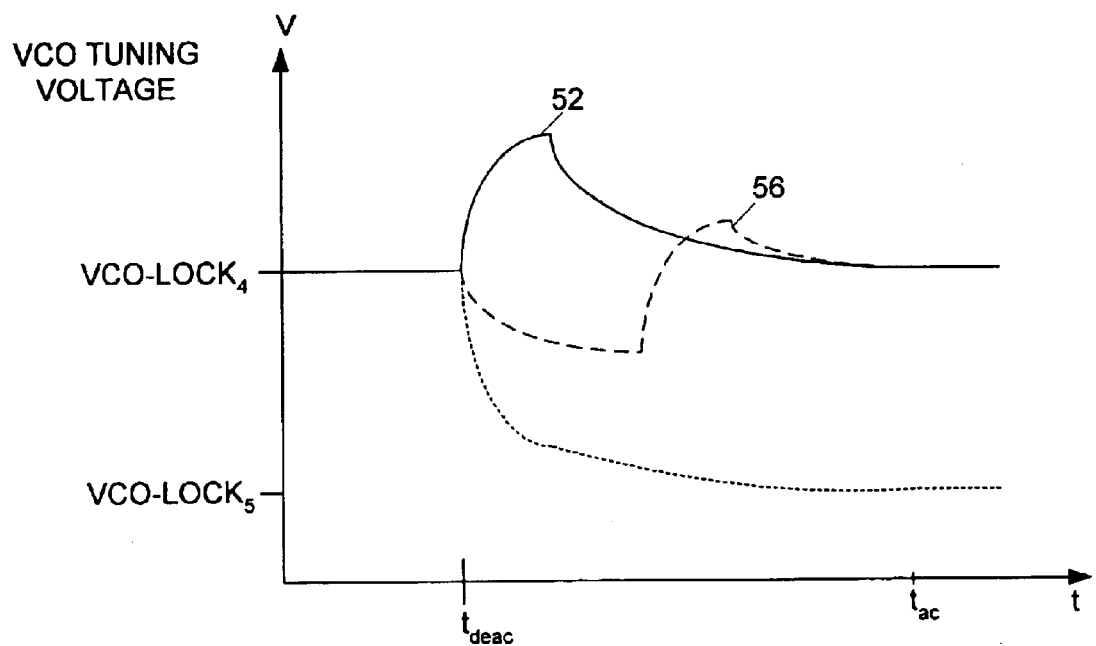
FIG. 6 is a graph of tuning voltage of the voltage-controlled oscillator shown in FIG. 1 in response to the outputs shown in FIG. 5.
Figure 7:
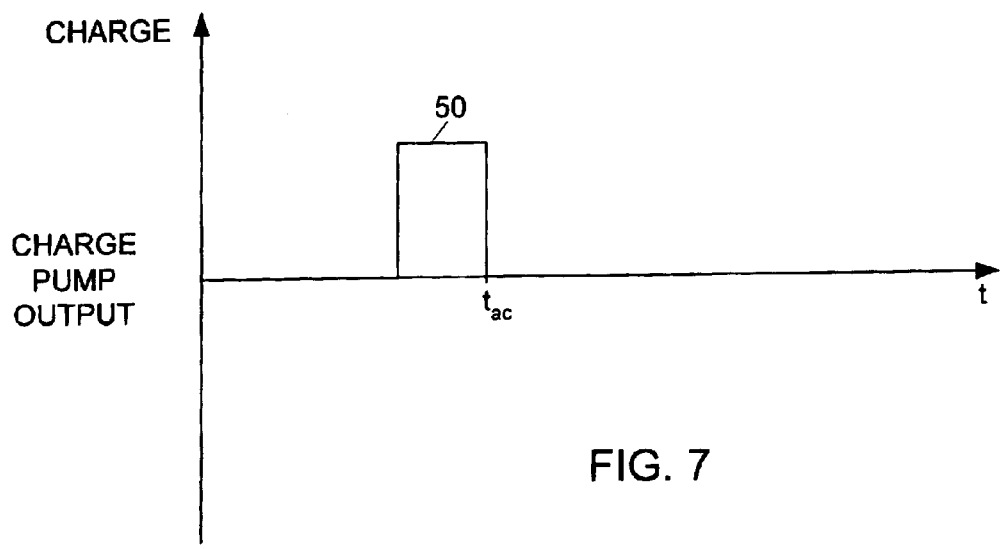
FIG. 7 is a graph of an output of the charge pump shown in FIG. 1.
Figure 8:
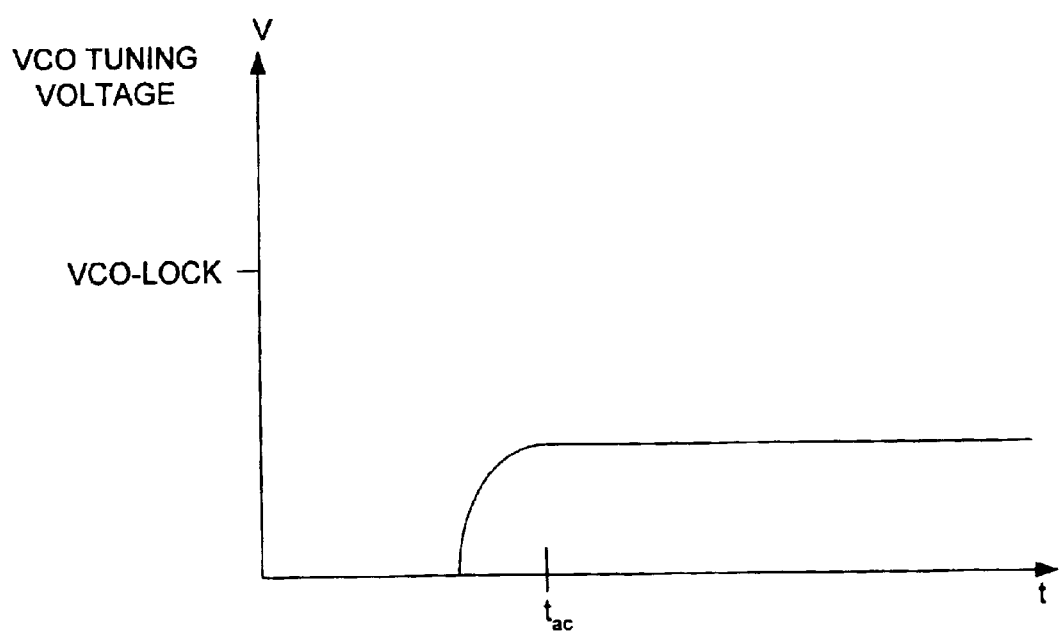
FIG. 8 is a graph of tuning voltage of the voltage-controlled oscillator shown in FIG. 1 in response to the output shown in FIG. 7.

Other techniques may be used to adjust the VCO tuning voltage during deactivated times of the PLL 10 such as providing charge from the charge pump 24 to the loop filter 14. Referring to FIGS. 1 and 5–6, in embodiments of the invention, the current DAC 26 can be eliminated and the A/D and control 28 coupled to the charge pump 24 and configured to control charge pump 24 to provide compensating charge during deactivated times of the PLL 10. The A/D and control 28 may be configured to actuate the charge pump 24 for times and amounts that will adjust the VCO tuning voltage as desired. In at least some embodiments, for example, assuming that the VCO tuning voltage is to be returned to a VCO lock voltage VCO-lock$_4$ (FIG. 6), the A/D and control 28 causes the charge pump 24 to activate at the deactivation time $t_{deac}$ of PLL 10 to provide a pulse 50 of charge to the loop filter 14. The pulse 50 causes a corresponding increase in the VCO tuning voltage, because the VCO 16 indirectly receives charge from the synthesizer 12. The increase in VCO tuning voltage is indicated in plot 52 in FIG. 6. Once the pulse 50 ends, the VCO tuning voltage, again indicated by the plot 52, decreases, e.g., due to leakage current of the loop filter 14, the charge pump 24, and/or the VCO 16. The duration and polarization of pulse 50 are determined by the A/D and control 28 such that the VCO tuning voltage returns to approximately the VCO lock voltage VCO-lock$_4$ by the next activation time $t_{ac}$. The pulse duration may typically be less than about 0.001% of the deactivated time.

The pulse of charge provided by the charge pump 24 can be before an initial activation time of the PLL 10. Thus, for example, it may be known how much charge, and in what polarity, needs to be provided by the charge pump 24, in response to signals from the control logic 20, to put the VCO tuning voltage to a VCO-lock level from a deactivation steady state where the VCO tuning voltage is about, or equal to, zero volts. In the deactivation steady state, a capacitor 17 of a resonant circuit 19 of the VCO 16 may be completely, or nearly completely, depleted of charge. The deactivation steady state may exist, e.g., if the PLL 10 has been deactivated for a long time, as when a system using the PLL 10 is turned off and is not in standby mode (e.g., a paging mode of a cellular telephone). In this case, and referring to FIGS. 1, 7–8, and 13, a process 80 of initially compensating the tuning voltage begins at stage 82 where the charge pump 24 is activated. At stage 84, indicia of the amount and polarization of initial charge to be provided by the charge pump 24 can be stored, e.g., in memory associated with (e.g., included in) the control logic 20 and retrieved by the control logic 20 in response to powering up of the charge pump 24. Alternatively, if the VCO frequency is, or is assumed to be, fairly linear relative to the tuning voltage, then a few voltage-frequency points could be stored, and other tuning voltages interpolated given a desired frequency. At stage 86, the control logic 20 sends signals to the charge pump 24 causing the pump 24 to supply the appropriate amount and polarization of initial charge in a pulse 60 to the loop filter 14 before the initial activation time $t_{ac}$ of the PLL 10. This causes the VCO tuning voltage to reach the lock voltage VCO-LOCK, preferably, approximately at the activation time $t_{ac}$, when, at stage 88, the PLL 10 is activated. Further adjustment of the VCO tuning voltage could be accomplished as discussed above using the initial and locked voltages.

Initial setting of the VCO tuning voltage may be accomplished, e.g., by not activating (i.e., delaying activation) of all components of the PLL 10 when the PLL 10 is initially powered up, while allowing the charge pump 24 and the control logic 20 to operate. It may be desirable to let counters in the system 10 run for at least one cycle before turning on the charge pump 24 to help avoid having a counter output reflect a frequency of the VCO while the loop filter 14 is charging. Such a counter output may undesirably affect the output of the charge pump 24, and put the VCO out of tolerance temporarily.

The pulse of charge provided by the charge pump 24 does not need to be at the initial portion of the deactivated time (between $t_{deac}$ and $t_{ac}$) of the PLL 10. As indicated by pulse 54, the A/D and control 28 can activate the charge pump 24 at other times or portions of the deactivated time of the PLL 10 to adjust the VCO tuning voltage. The VCO tuning voltage, as affected by the pulse 54 is shown in FIG. 6 by a plot 56. Also, more than one pulse can be provided to the filter 14 by the pump 24 during the deactivated time.

Furthermore, if the VCO tuning voltage is to be set to a different VCO lock voltage, such as from VCO lock voltage VCO-lock$_4$ to a VCO lock voltage VCO-lock$_5$, then different amounts of charge than those provided by pulses 50 or 54 can be provided by the charge pump 24. Accordingly, the VCO lock voltage VCO-lock$_5$ is lower than it would be if no compensating charge or currents were provided to the loop filter 14 during the deactivated time of the PLL 10. Thus, the A/D and control 28 controls the charge pump 24 to provide a pulse 58 that is opposite in polarity to the pulse 50. The pulse 58 causes the VCO tuning voltage to decrease further than it would absent any compensation during the deactivated time of the PLL 10. The pulse amount is determined such that is causes the VCO tuning voltage to be at approximately the VCO lock voltage VCO-lock$_5$ at the next activation time $t_{ac}$.

Figure 9:
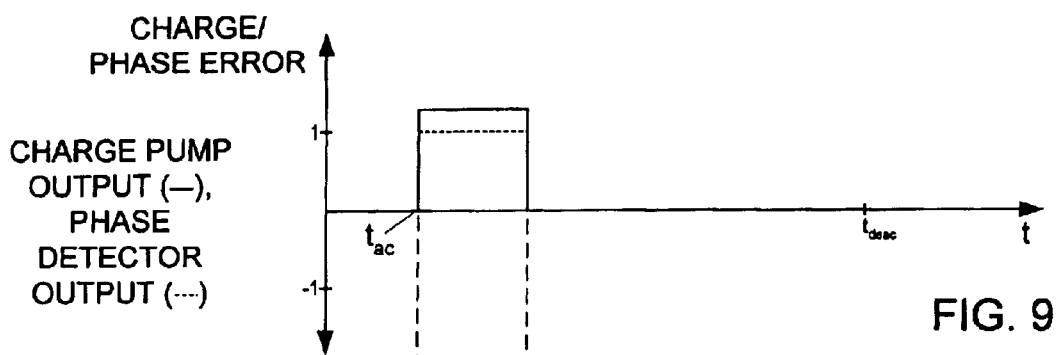
FIG. 9 is a graph of outputs of the charge pump and a phase detector shown in FIG. 1.
Figure 10:
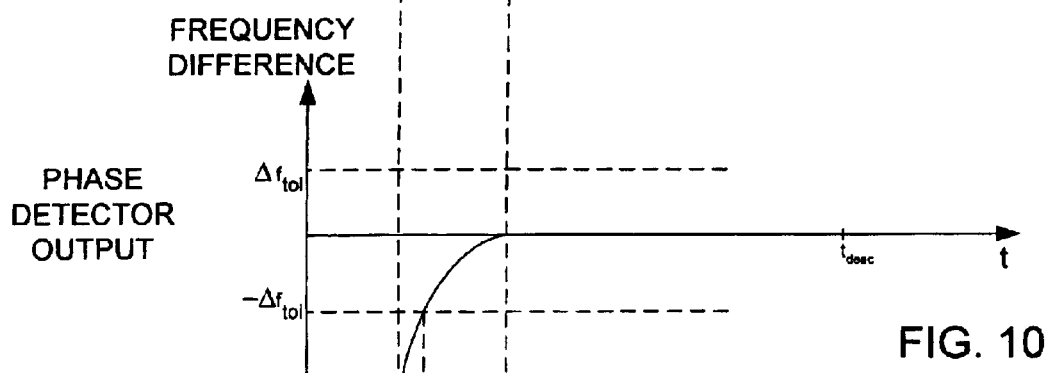
FIG. 10 is a graph of a frequency difference between an output of the voltage-controlled oscillator shown in FIG. 1 and a frequency of a reference signal shown in FIG. 1.
Figure 11:
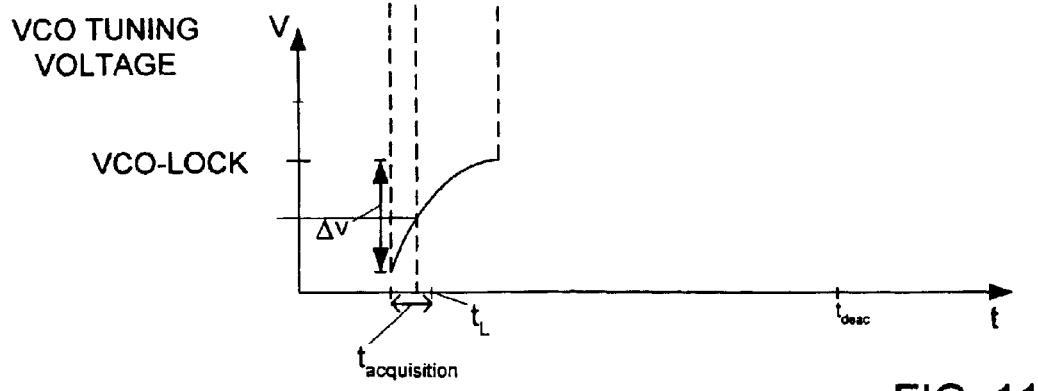
FIG. 11 is a graph of tuning voltage of the voltage-controlled oscillator shown in FIG. 1 in response to the output of the charge pump shown in FIG. 9.

Other techniques, e.g., based on signals in the PLL 10 during active times, may also be employed for determining the amount of compensation that will adjust the VCO tuning voltage to a desired voltage before the next activation time. Referring to FIGS. 9–11, during active times of the PLL 10 between activation time $t_{ac}$ and deactivation time $t_{deac}$, the charge pump 24 is activated and provides charge to the loop filter 14. This charge adjusts the VCO tuning voltage of the VCO 16 until the PLL 10 is locked, and thereafter adjusts the VCO tuning voltage as needed due to drift in the VCO tuning voltage. Initially, at the activation time $t_{ac}$, the VCO tuning voltage may differ from the VCO lock voltage VCO-lock by an amount $\Delta V$ as shown in FIG. 11. The charge pump 24 provides charge to the loop filter 14 until the PLL is locked at a time $t_L$, marking the end of the acquisition time $t_{acquisition}$. FIG. 10 shows the corresponding difference in phase of the VCO output signal and the reference signal REF. After the lock time $t_L$, as the phase begins to differ between the VCO output signal and the reference signal REF, the difference will eventually exceed an acceptable tolerance $\Delta\phi_{to\ 1}$ in the phase difference. When the phase difference exceeds the tolerance $\Delta\phi_{to\ 1}$, the charge pump 24 is activated to provide charge in an appropriate polarity and amount to return the VCO tuning voltage to the VCO lock voltage. Over the active time of the PLL 10, and especially during the acquisition time $t_{acquisition}$, both the charge pump output and the error signal output by the phase detector are indicative of the amount by which the VCO tuning voltage differs from the VCO-lock voltage at the activation time $t_{ac}$.

The phase detector output or the charge pump output can be used to determine the amount of deactivated-time compensation to be employed. This compensation corresponds to the difference in VCO tuning voltage at the activation time $t_{ac}$ and the desired VCO-lock voltage. An indication of this difference can be determined by integrating the phase detector output or the charge pump output during the acquisition time $t_{acquisition}$, during the acquisition time $t_{acquisition}$ plus some additional time to allow the VCO tuning voltage to approach, and possibly equal, the VCO-lock voltage, or during the entire active time between the activation time $t_{ac}$ and the deactivation time $t_{deac}$. The integration may result in compensation that is slightly off of an ideal compensation if the VCO tuning voltage at the end time of the integration is not at the desired VCO lock voltage. This slight error, however, will likely be better than no compensation, and thus may still be useful.

To implement these techniques, the A/D and control 28 can be configured to monitor the phase detector output or the charge pump output and to integrate the monitored output. The A/D and control 28 may be configured to use the integrated output to determine a digitized control signal for the charge pump 24 or, if used, the current DAC 26. The indication determined by the A/D and control 28 can be based upon maintaining or returning the VCO tuning voltage to the prior VCO-lock voltage, or based on setting the VCO tuning voltage to a voltage that differs from the previous VCO-lock voltage. The digitized control signal can be, or can be added to or subtracted from, a count of a counter 35 in the charge pump 24 (or, e.g., in the A/D and control 28). The count represents the length of time that a reduced output of the charge pump 24, or a separate charge pump, will provide charge to the loop filter 14 during the next deactivated time to properly compensate for charge lost by the loop filter 14.

The A/D and control 28 can have an output of one or more bits. A one-bit output could indicate a fixed adjustment amount, of charge for the loop filter 14, of a polarity corresponding to the value of the bit. The total adjustment amount could vary depending on how long the charge pump 24 provides charge in response to the A/D and control output. A multi-bit output of the A/D and control 28 could indicate both the polarity and amount of charge to provide to the loop filter 14.

As shown in the embodiment of FIG. 9, the charge pump output and phase detector outputs are similar. Each output is a square pulse with a width proportional to the initial frequency difference of the VCO output signal and the reference signal REF. The phase detector may have a value of either 1 or −1. Alternatively, this may be implemented with two digital signals having values of 0 or 1, with one signal indicating on/off of the charge pump 24 and the other signal indicating the polarity for the charge pump output.

While various embodiments of the application have been described, it will be apparent to those of ordinary skill in the art that many more embodiments and implementations are possible that are within the scope of this invention. Accordingly, the invention is not to be restricted except in light of the attached claims and their equivalents.

What is claimed:

1. A phase-locked loop (PLL) system having active times and inactive times, the system comprising:
   an apparatus configured to provide charge;
   a voltage-controlled oscillator (VCO) having a VCO input coupled and configured to receive charge from the apparatus, a tuning voltage at the VCO input being at a VCO-lock voltage when the phase-locked loop system is locked to a frequency; and
   a controller coupled to the apparatus and configured to provide a control signal to the apparatus to control the charge provided by the apparatus;
   wherein the apparatus is configured to provide, during at least a portion of an inactive time of the PLL system and in response to the control signal, charge such that the tuning voltage at the VCO input is approximately at the VCO-lock voltage at a start of an active time of the PLL system; and
   wherein during the inactive time of the PLL at least one component of the PLL for locking to a frequency is inoperative.

2. The system of claim 1 wherein the apparatus includes a current supply that is configured to supply the charge during at least a portion of an inactive time of the system.

3. The system of claim 2 wherein the current supply is configured to provide a compensating current during substantially an entire inactive time between active times.

4. The system of claim 2 wherein the current supply includes a plurality of current sub-supplies configured to provide discrete current amounts that are related to each other in a binary progression.

5. The system of claim 2 wherein the current supply includes a plurality of current mirrors.

6. The system of claim 5 wherein the plurality of current mirrors are coupled to selectively provide current from multiple current supplies to a common destination concurrently.

7. The system of claim 1 wherein the apparatus includes a charge pump configured to provide the sufficient energy during an initial portion of the inactive time.

8. The system of claim 7 wherein the initial portion constitutes less than about 0.001% of the inactive time.

9. The system of claim 1 wherein the active time of the PLL system is an initial active time of the PLL system.

10. The system of claim 1 wherein the controller is configured to retrieve information from a memory to provide the control signal.

11. The system of claim 1 wherein the controller is coupled to the VCO and is configured to receive an indication of a beginning tuning voltage at the VCO input at the start of an active time of the PLL system and an indication of the VCO-lock voltage, and to determine the control signal using the indications of the beginning tuning voltage and the VCO-lock voltage.

12. The system of claim 11 wherein the controller is configured to determine the control signal based upon a difference between the VCO-lock voltage and a voltage related to the beginning tuning voltage.

13. The system of claim 12 wherein the active time of the PLL system is at least a second active time of the PLL system following at least a first, previous, active time of the PLL system.

14. The system of claim 12 wherein the related voltage is the beginning voltage.

15. The system of claim 12 further comprising a filter coupled to receive signals with corresponding charge from the apparatus, to filter the signals received from the apparatus, and to provide output signals with associated charge to the VCO in response to the received signals.

16. The system of claim 1 wherein the active time of the PLL system is at least a second active time of the PLL system following at least a first, previous, active time of the PLL system, where the VCO-lock voltage is a first VCO-lock voltage when the phase-locked loop system is locked to a first frequency during the first active time of the PLL system, the tuning voltage at the VCO input being at a second VCO-lock voltage when the phase-locked loop system is locked to a second frequency, and where the apparatus is configured to provide, during at least a portion of an inactive time of the PLL system and in response to the control signal, charge such that the tuning voltage at the VCO input is approximately at the second VCO-lock voltage at the start of the second active time of the PLL system.

17. A portable telephone comprising:
   a battery;
   an antenna; and
   a receiver coupled to the antenna and to the battery and including a phase-locked loop (PLL) configured to operate in an active mode and a paging mode, the paging mode intermittently activating the PLL to check as to whether an incoming call is being received, the PLL including:
      a charge supply;
      a voltage-controlled oscillator (VCO) having a VCO input coupled and configured to receive charge from the charge supply, a tuning voltage at the VCO input being at a VCO-lock voltage when the phase-locked loop system is locked to a frequency; and
      a controller configured to determine a total amount of charge to provide to the VCO input during a deactivated time period of the PLL to cause the tuning voltage to be approximately equal to the VCO-lock voltage at a beginning of an active time period of the PLL, the controller being further configured to cause the charge supply to provide the total amount of charge to the VCO during at least a portion of the deactivated time period of the PLL;
      wherein during the deactivated time period of the PLL at least one component of the PLL for locking to a frequency is inoperative.

18. The telephone of claim 17 wherein the controller is configured to compare indicia of the tuning voltage approximately at an activation time of the PLL and the VCO-lock voltage.

19. The telephone of claim 18 wherein the indicia are the tuning voltage and the VCO-lock voltage.

20. The telephone of claim 17 wherein the charge supply includes at least one current supply.

21. The telephone of claim 20 wherein the at least one current supply includes a plurality of current supplies configured to provide discrete current amounts related to each other in a binary progression.

22. The telephone of claim 18 wherein the controller is configured to determine amounts and polarities of charge provided to the VCO during at least a portion of the active time of the PLL.

23. The telephone of claim 22 wherein the at least a portion of the active time is substantially the entire active time.

24. The telephone of claim 23 wherein the at least a portion of the activate time is a time from the activation time until the PLL is locked.

25. The telephone of claim 17 wherein the controller is configured to integrate charge from the charge supply.

26. The telephone of claim 17 wherein the controller is configured to integrate an error signal from a phase detector of the PLL.

27. The telephone of claim 17 wherein the controller is configured to cause the charge supply to provide the total amount of charge to the VCO input during the deactivated time period of the PLL to cause the tuning voltage to change from a deactivated time steady state to approximately the VCO-lock voltage substantially before an active time of the PLL.

28. The telephone of claim 17 wherein the controller is configured to cause the charge supply to provide the total amount of charge to the VCO during at least a portion of the deactivated time period of the PLL between intermittent active times of the PLL.

29. A method comprising:
   activating at least a charge pump of a phase-locked loop (PLL) system;
   receiving indicia of initial charge to provide by the charge pump to cause a tuning voltage of a voltage-controlled oscillator (VCO) to become at least approximately equal to a VCO-lock voltage from a deactivation steady state of the PLL system, the tuning voltage of the VCO being at the VCO-lock voltage when the PLL system is locked to a frequency;
   causing the charge pump to provide the initial charge while at least one component of the PLL system for locking to a frequency is inoperative; and
   activating the PLL system when the VCO tuning voltage is approximately equal to the VCO-lock voltage such that the PLL system attempts to lock to a frequency.

30. The method of claim 29 wherein the receiving includes retrieving the indicia from memory.

31. The method of claim 29 wherein the activating of at least the charge pump activates less than all portions of the PLL system necessary to allow the PLL system to lock to a frequency.

32. The method of claim 29 wherein the VCO tuning voltage is approximately zero volts when the VCO is in the deactivation steady state.

33. The method of claim 29 wherein a capacitor of a resonant circuit of the VCO is substantially completely depleted of charge when the VCO is in the deactivation steady state.

34. The system of claim 4 wherein a smallest of the discrete current amounts is less than an amount that would swing an output of the VCO from one extreme of a desired frequency tolerance of the PLL system to another extreme of the desired frequency tolerance.

* * * * *

UNITED STATES PATENT AND TRADEMARK OFFICE
CERTIFICATE OF CORRECTION

PATENT NO. : 6,717,475 B2 Page 1 of 1
APPLICATION NO. : 10/032848
DATED : April 6, 2004
INVENTOR(S) : Evan S. McCarthy It is certified that error appears in the above-identified patent and that said Letters Patent is hereby corrected as shown below:

Claim 24, col. 12, line 2, delete "activate" and insert --active--.

Signed and Sealed this

Fifth Day of February, 2008

JON W. DUDAS
*Director of the United States Patent and Trademark Office*